United States Patent [19]

Chaki

[11] Patent Number: 4,491,030

[45] Date of Patent: Jan. 1, 1985

[54] LINK MECHANISM IN PUSHBUTTON-OPERATED WAVEBAND OR STATION SELECTOR

[75] Inventor: Takao Chaki, Tokyo, Japan

[73] Assignee: Clarion Co., Ltd., Tokyo, Japan

[21] Appl. No.: 361,335

[22] Filed: Mar. 24, 1982

[30] Foreign Application Priority Data

Mar. 31, 1981 [JP] Japan ................... 56-47855

[51] Int. Cl.$^3$ .............................................. H03J 5/12
[52] U.S. Cl. .................... 74/10.33; 74/10.8; 334/7
[58] Field of Search ............... 74/10.33, 10.37, 10.8; 334/7

[56] References Cited

U.S. PATENT DOCUMENTS

| 4,189,949 | 2/1980 | Righi et al. | 74/10.33 |
| 4,204,179 | 5/1980 | Kataoka et al. | 334/7 |
| 4,308,757 | 1/1982 | Dellantonio | 74/10.33 |

FOREIGN PATENT DOCUMENTS 150610 11/1980 Japan .................... 74/10.33

Primary Examiner—Allan D. Herrmann
Attorney, Agent, or Firm—Russell E. Hattis

[57] ABSTRACT

A link mechanism in a pushbutton-operated waveband or station selector in which a link with a plurality of arms is pivotably fitted on a pivotal shaft; in order to couple to these link arms members which move in different directions, each of the members being provided with a guide means extending perpendicular to the moving direction of the member, a guide member provided at each of said arms of the link being slidably engaged with the guide means; the angle formed between each of the link arm and the moving direction of each member coupled with the arm being so set to always be greater or smaller than a right angle within the moving range of each member that no point of inflection will occurs in the moving orbit of the guide member of each arm within the guide means of each member.

1 Claim, 7 Drawing Figures

LINK MECHANISM IN PUSHBUTTON-OPERATED WAVEBAND OR STATION SELECTOR

BACKGROUND OF THE INVENTION

1. Field of the Invention

The present invention relates to an improved and novel link mechanism in a pushbutton-operated waveband or station selector or tuner.

2. Description of the Prior Art

In the pushbutton-operated waveband or station selector, as a selected pushbutton is depressed, the memory plate is moved and coupled with the core slide so that the pressure applied to the pushbutton is transmitted to the core slide on which a core is fitted, this core being thus inserted into or extracted out of the tuning coil, or as the manual tuning knob is turned, it causes the core slide to move so as to change the inserted position of the core inside the tuning coil. In many of such conventional techniques, the core slide on which the coil is secured moves in a direction different from that in which the memory plate to shift the core slide or the tuning shaft-side shifting member moves. For example, the memory plate and the tuning knob-side shifting member are so disposed as to be movable in the direction of the pusbutton width, while the core slide is so disposed as to be movable in the direction perpendicular (front-rear direction of the pushbutton) to the moving direction of the memory plate and tuning knob-side shifting member. Therefore, in order to operatively couple these members, there is provided between them a link which provides for an operative coupling of them and changes the moving directions of them.

In the conventional pushbutton-operated waveband or station selector, the arms of a link are disposed perpendicular to the moving directions of the members connected with the link arms as shown in FIG. 1. As seen in FIG. 1, a link 91 having generally an L shape is rotatably fitted at the corner portion thereof on a pivotal shaft 92; one of the arms 91A of this link 91 has provided at the end thereof a guide roller 93 which is inserted into an elongated guide hole 95 formed in a memory plate 94 at the end thereof and which forms a right angle with the moving direction of the memory plate. The other arm 91B of the link 91 is extended to a core slide 96 which moves in a direction perpendicular to the memory plate 94; a guide roller 97 provided at the end of this second arm 91B is inserted into a guide hole 98 formed in the core slide 96 and which forms a right angle with the core slide.

In such conventional type of pushbutton-operated waveband or station selector, when the memory plate 94 is moved laterally by depressing the pushbutton, the first arm 91A coupled by means of the guide roller 93 and guide hole 96 to the memory plate is pressed so that the link 91 pivots about its pivotal shaft 92. Then, the core slide 96 coupled to the end of the second arm 91B of the link 91 by means of the guide roller 97 and guide hole 98 is moved so that a core 99 fitted on the core slide 96 is moved for selection of a waveband or station.

In the above-mentioned conventional pushbutton-operated waveband or station selector, the guide rollers 93 and 97 provided at the ends of link arms delineate a circular orbit about the pivotal shaft 92 so that they reciprocate in the guide hole 95 in the memory plate and guide hole 98 in the core slide in the direction of the guide hole length as shown in FIG. 2. Namely, the memory plate and core slide moves in the linear direction, while the guide rollers inserted in the guide holes formed in the memory plate and core slide, respectively, are reciprocated along the edges of the guide holes. For example, when the core slide 96 is positioned on this side, the second arm 91B of the link 91 forms with the moving direction of the core slide an angle smaller than right angle; the guide roller 97 is then positioned inside the guide hole 98 (on the side of pivotal shaft 92). As the memory plate 94 moves and so the link 91 starts pivoting, the end of the second arm 91B moves upward while the guide roller 97 moves outwardly within the guide hole 98. At this time, the core slide 96 in which the guide hole is formed will be forced outwardly. When the link 91 pivots and the second arm 91B and core slide move in such directions, respectively, as form together a right angle, the guide roller 97 reaches an outermost position of the guide hole 98, which position being a point of inflection around which the guide roller moves inwardly of the guide hole while forcing the core slide 96 upwardly. Accordingly, the core slide 96 is so forced that it is pressed inwardly (in a direction opposite to that in which it is pressed before the point of inflection is reached. As the result, while it is moved in front-rear direction, the core slide 96 is deflected in right-left direction by the link so that the core fitted on the core slide 96 wobbles, which is incovenient in that a frequency deviation occurs at selection of a waveband or station; further, if the core slide 96 is applied with a force which causes the core to wobble in right-left direction, the core slide 96 itself will not be smoothly moved in front-rear direction, which is also inconvenient in that a large force is required to operate the pushbutton in order to move the core slide 96. In addition, since the existence of such point of inflection causes the guide roller to rotate within the guide hole 97 in a different directions at points short of and beyond the point of inflection. Thus, a pushing force is not smoothly transmitted from the link to the core slide 96.

Such phenomenon does not occur only at the coupling between the link 91 and core slide 96, but also at the coupling between the first arm 91A and the memory plate 94 in the conventional apparatus shown in FIG. 1.

In the pushbutton-operated waveband or station selector or tuner, the member on the tuning shaft side is coupled with the core slide 96 by means of another link so that the core slide 96 may be moved in front-rear direction by operating the tuning shaft on the manual tuning side; if a point of inflection of the link exists in such coupling portion, the entire pushbutton-operated waveband or station selector incurs many factors which cause the loss of power transmission for movement of the core slide and make unstable the movement of core slide, which is a great drawback in improvement in performance of the pushbutton-operated waveband or station selector.

SUMMARY OF THE INVENTION

Accordingly, the present invention has an object to overcome the above-mentioned drawbacks of the link mechanism of the conventional pushbutton-operated waveband or station selector, by providing a link mechanism in a pushbutton-operated waveband or station selector, in which the angle between each arm of the link and the moving direction of the member coupled with the arm is always kept in a range of greater or smaller than a right angle so that no point of inflection appears in the moving ranges of each link arm and of each member coupled with the arm.

Further, the link mechanism according to the present invention will be better understood from the explanation made, by way of example, of the embodiment of the present invention with reference to the accompanying FIG. 3 and subsequents; in the embodiment of the link mechanism according to the present invention, a three-armed link is used as link, of which the first arm is coupled with an idler rack operatively coupled with a tuning knob, the second arm is with a core slide and the third arm is coupled with a memory plate.

BRIEF DESCRIPTION OF THE DRAWINGS

These and other objects and advantages of the present invention will be apparent from the ensuing explanation made of the embodiments with reference to the accompanying drawings, in which.

DETAILED DESCRIPTION OF THE PREFERRED EMBODIMENTS

FIGS. 3 thru 6 show an embodiment in which the present invention is adopted in a conventional pushbutton-operated waveband or station selector or tuner, illustrating a kick arm 12 (FIG. 5) and memory plate 25 and the link mechanism of the present invention as well; illustration and explanation of other mechanisms of the pushbutton-operated waveband or station selector are omitted.

Figure 5:
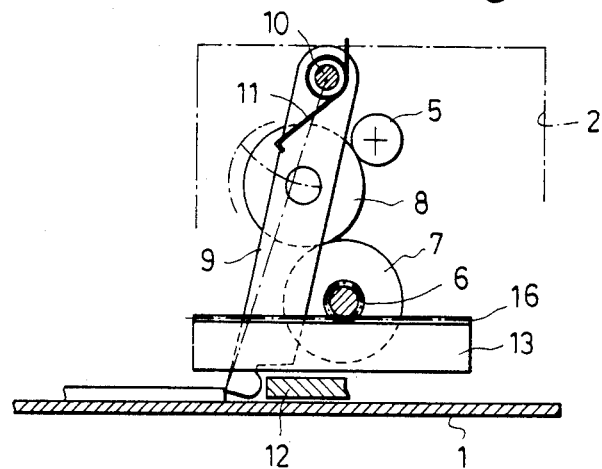
FIG. 5 is a front view of the tuning shaft portion of the embodiment in FIG. 3.

In the Figures, the reference numeral 1 denotes a bottom plate of the apparatus, and 2 a tuning shaft mount plate made of a front vertical rising portion of this bottom plate 1. In the tuning shaft mount plate 2 rotatably fitted is a tuning shaft 3 at the front end of which a tuning knob 4 is fixed. The rear end of the tuning knob 4 is protruded to the rear side of the mount plate 2. A frictional wheel 5 is fixed to the protrusion of the tuning knob 4. Below the tuning shaft 3 of the mount plate 2 rotatably mounted is an idler plate drive gear 6 at the rear end of which another frictional wheel 7 is secured opposite to the frictional wheel 5 of said tuning shaft 3. An idler roller 8 is so disposed between the two frictional wheels 5 and 7 as to freely get in contact with the wheels. This idler roller 8 is rotatably installed on a clutch lever 9 as shown in FIG. 5. The clutch lever 9 is pivotally mounted at the upper end thereof on a pivotal shaft 10 provided on the tuning shaft mount plate 2, and is always forced to the side of tuning shaft 3 by a torsion spring 11 provided on the pivotal shaft so that the idler roller 8 provided on the clutch lever 9 is forced on the frictional wheels 5 and 7. The lower end of the clutch lever 9 is extended to a position near the bottom plate 1 of the apparatus. A kick arm 12 engages at the lower end of the clutch lever 9. As the pushbutton is depressed, the kick arm 12 is moved transversely over the bottom plate 1; when the pushbutton is depressed, the kick arm 12 will force the clutch lever 9 in such a direction so that the idler roller 8 will be disengaged from friction wheels 5 and 7 against the force of the torsion spring 11. There is provided at the rear of the tuning shaft mount plate 2 an idler plate 13 which is guided by a guide hole 14 (FIG. 4) extending across the idler plate and by a pin 15 inserted in the guide hole 14 to move reciprocally transversely or in the direction of the apparatus width. The idler plate 13 has formed at the front edge thereof a rack gear 16 facing upward and which is in mesh with said idler plate drive gear 6. Further, the idler plate 13 has formed therein a guide hole 17 extending longitudinally, in which rotatably fitted is a guide roller 19 provided at the end of the first arm 18a of a three-armed link 18.

The three-armed link 18 is rotatably mounted on a pivotal shaft 20 fixed to the bottom plate 1, and has three arms which are protruded frontward, rearward and laterally, respectively, of the apparatus about the pivotal shaft 20. The first arm 18a is protruded frontward of the apparatus as mentioned above, and has provided at the free end thereof a guide roller 19 which is fitted in the guider hole 17 in the idler plate 13; the second arm 18b of the link 18 is protruded laterally of the apparatus, or transversely of the face of the unit and has a free end on which a core slide 21 engages. The core slide 21 has provided at the lower end thereof a horizontal coupling plate 22 in which formed is a guide hole 23 extending transversely or in the direction of apparatus width and in which a guide roller 24 provided at the end of the second arm 18b is rotatably fitted. The third arm 18c of the link 18 is projecting rearward of the apparatus and has coupled at the end thereof a memory plate 25 in which a guide hole 26 extending longitudinally. A guide roller 27 provided at the end of the third arm 18c is rotatably fitted in the guide hole 26. Similar to the memory plate in the conventional thin tuning apparatus, the memory plate 25 is moved laterally of the apparatus over a distance corresponding to the position of the setting plate provided to each of the pushbuttons when the button is depressed.

Figure 6:
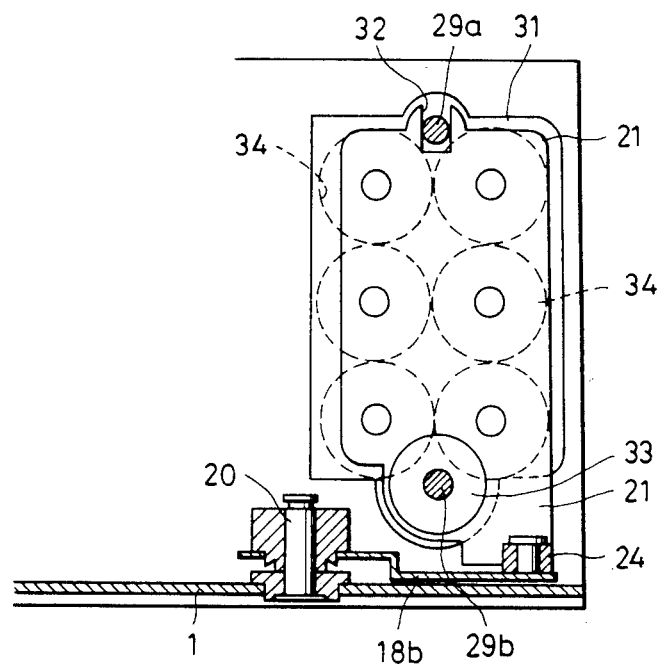
FIG. 6 is a front view of the core slide portion of the embodiment in FIG. 3.

The core slide 21 is disposed vertically in the pushbutton-operated waveband or station selector; it has horizontally installed at the rear thereof six cores 28, for example; the core slide 21 is slidably installed on the two upper and lower guide shafts 29a and 29b disposed in a front-rear direction or longitudinally of the apparatus. These guide shafts 29a and 29b are so installed between a guide shaft mount plate 31 disposed in front of the core slide 21 and a coil mount plate 30 disposed at the back of the core slide 21 as to bridge the mount plates 30 and 31. Further, a concave portion 32 is formed in the upper per center of the core slide 21 as shown in FIG. 6, and the upper guide shaft 29a is slidably fitted in the concave portion 32. The core slide 21 has fixed at the lower portion thereof a guide pipe 33 in the front-rear direction of the apparatus which is slidably supported on the lower guide shaft 29b.

There are fixed at the rear of the previously-mentioned coil mount plate 31 tuning coils 34 horizontally in correspondence with the cores 28 which are so inserted in the respective tuning coils 34 as to be moved in front-rear direction. The rear ends of these tuning coils 34 abut on a terminal board 35 for connection of each tuning coil lead. The tuning coils 34 are supported by the coil mount plate 31 and the terminal board 35 from the front and rear, respectively.

Figure 7:
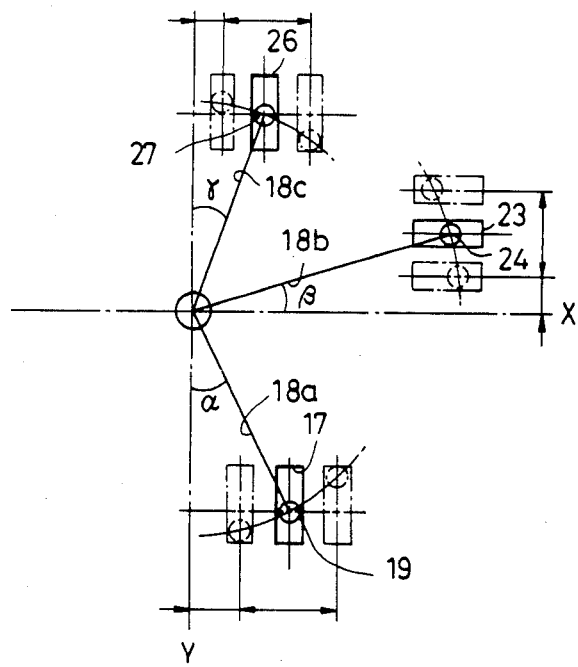
FIG. 7 is a schematic plan view showing the action of the link mechanism according to the present invention.

According to the present invention, the three arms of the link 18 are coupled with the idler rack 13, core slide 21 and memory plate 25, respectively, with angles between them as shown in FIG. 7. The first arm 18a is extended in a direction slanted by a predetermined angle $\alpha$ with respect to the lateral side of the apparatus (on the core slide side), rather than in a direction perpendicular to the moving direction of the idler plate 13. The second arm 18b is extended rather in a direction slanted by a predetermined angle $\beta$ with respect to the rear side of the apparatus, than in a direction perpendicular to the moving direction of the core slide 21. Further, the third arm 18c extends rather in a direction slanted by a predetermined angle $\gamma$ with respect to the lateral side of the apparatus (on core slide side), than in a direction perpendicular to the moving direction of the memory plate 25. Thus, the angles formed by each of the link arms and the moving direction of each of the members coupled with the arm is always greater than a right angle within the rotating range of the link 18 in case of the first and second arms 18a and 18b, while the angle in case of the third arm 18c is always smaller than a right angle; the guide roller provided at the end of each link arm is so set that when the link is pivoted, it is moved from one end to the other of the guide hole formed in each of the member coupled with the arm and never travels over-center as is the case of the prior art linkage shown in FIG. 1.

The pushbutton-operated waveband or station selector adopting the link mechanism according to the present invention is constructed as mentioned in the above, and functions as decribed below:

For selection of a station or waveband by operating the manual tuning knob 4, the knob 4 is turned to rotate the frictional wheel 5 provided at the end of the tuning shaft 3. Since the idler roller 8 is in forced contact with and between the frictional wheel 5 and the frictional wheel 7 of the idler plate drive gear 6, the rotation of the frictional wheel 5 is transmitted through the idler roller 8 to the frictional wheel 7, thus the idler plate drive gear 6 is rotated. Then, the idler plate 13 in mesh with the idler plate drive gear 6 by means of the rack gear 16 is moved in lateral direction to force the first arm 18a of the link 18 in the lateral direction. As the result, the link 18 pivots about the pivotal shaft 20 so that the end of the second arm 18b of the link 18 is moved in the front-rear direction of the apparatus. Since the core slide 21 is coupled with the end of the second arm 18b of the link by means of the guide hole 23 and guide roller 24, the core slide 21 is moved in the front-rear direction under the guidance of the guide shafts 29a and 29b. Then, the core 28 installed at the rear side of the core slide 21 is also moved in the front-rear direction so that the inserted position of the core inside the tuning coil 34 is changed; thus, the inductance of the tuning coil 34 is so changed as to provide a tuning with a waveband or station. At the same time, the third arm 18c of the link 18 is moved in the opposite direction so that the memory plate 25 coupled with the end of the third arm 18c is also moved in the lateral direction and stopped at a position corresponding to the inserted position of the core.

On the contrary, when a pushbutton corresponding to a desired station or waveband is depressed, the kick arm 12 is moved as interlocked with the depression of the button (not shown) and forces the clutch lever 9 against the action of torsion spring 11 in the opposite direction away from the tuning shaft 5. As the result, the idler roller 8 mounted on the clutch lever 9 leaves the frictional wheels 5 and 7 so that the idler rack drive gear 6 and the frictional wheel 7 are freely rotatable as not limited by the tuning shaft 3.

When the memory plate 25 is forced by the setting pin provided in the pusbutton in this condition, the plate 25 is moved in the lateral direction. Then, the third arm 18c of the link 18 coupled with the memory plate 25 by means of the guide hole 26 and guide roller 27 is forced in the lateral direction so that the link 18 is pivoted about the pivotal shaft 20. The end of the second arm 18b of the link 18 is moved in the front-rear direction, thus also the core slide 21 coupled with the end of this arm is moved in the front-rear direction so that the inserted position of the core 28 inside the tuning coil 34 is changed, thus providing a tuning with a desired or selected station or waveband. In this case, since the first arm 18a of the link 18 is coupled with the idler plate 13, also this idler plate 13 is moved in the opposite direction to the memory plate 25. In this case, however, the idler plate 13 will rotate the idler plate drive gear 6 only, not the idler roller 8 and tuning shaft 3. Therefore, the idler plate 13 is smoothly moved and the link 18, core slide 21 and the memory plate 25 which may be considered tuning members coupled with the idler plate 13 are smoothly moved.

In case the core slide is moved by operating the pushbutton or tuning knob in this way, the three-armed link coupled with these members acts as follows: That is, when the core slide 21 is positioned at the front-most position of the apparatus, the guide roller 24 provided at the end of the second arm 18b is positioned at the outermost position of the guide hole 23 in the core slide. On the other hand, the guide rollers 19 and 27 provided at the ends of the first and third arms 18a and 18b, respectively, are positioned at the front ends of the guide holes 17 and 26 in the idler plate 13 and memory plate 25, respectively. When the tuning shaft 3 is turned to move the idler plate 13 outwardly of the apparatus or when a pushbutton is depressed to move the memory plate 25 inwardly of the apparatus, in this condition, the link 18 is pivoted about the pivotal shaft 20 as forced by the idler plate 13 or memory plate 25. In this case, the guide roller 19 provided on the first arm 18a of the link 18 and the guide roller 27 provided on the third arm 18c are moved from the front end toward the rear end of the guide hole 17 or 26, delineating a circuit orbit, respectively. At the same time, the guide roller 24 provided at the end of the second arm 18c of the link 18 forces the core slide 21 while delineating a circular orbit, and moves from the outer end toward the inner end of the guide hole 23. When the link 18 pivots a full turn so that each of the members coupled with the link is moved over the entire stroke, each of the guide rollers moves from one end to another of the guide hole in which it is fitted, while no reciprocal movement of them occurs in the guide holes; therefore no point of inflection or over-center appears.

As having been described in the foregoing, the link mechanism according to the present invention is so constructed that the angle formed between each of the arms forming together the link and the moving direction of each member coupled with the arm will be always greater or less than a right angle within the moving range of each member, thus preventing any point of inflection from appearing in the orbit defined by each of the link arms. Accordingly, the member to be forced by each of the link arms is forced always from one direction while it is being moved, which results in no difference in direction from the movement before the point of inflection to that after that point as in the conventional link mechanism. Therefore, no wobble occurs in each of the members caused to move by the link so that they are moved very smoothly. Because of this elimination of wobble in the couplings between the members and link, each of the members moved by the link is always stopped in a fixed position so that the inserted position inside the tuning coil of the core interlocked with the operation of the link is constant, thus assuring effect prevention of frequency deviation, etc.

Figure 1:
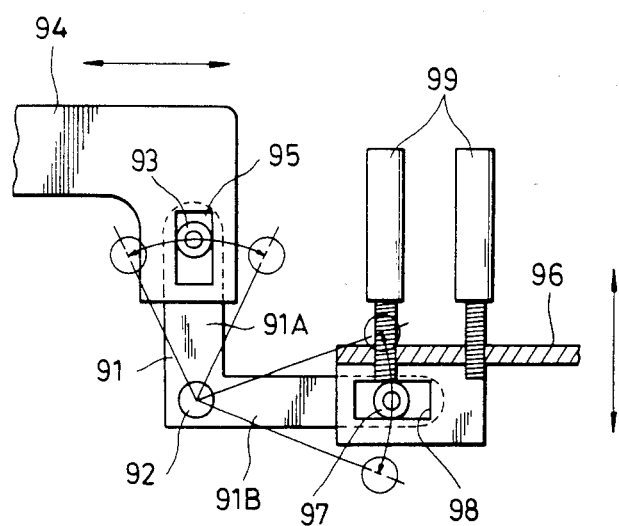
FIG. 1 is a plan view showing an example of conventional link mechanism.
Figure 2:
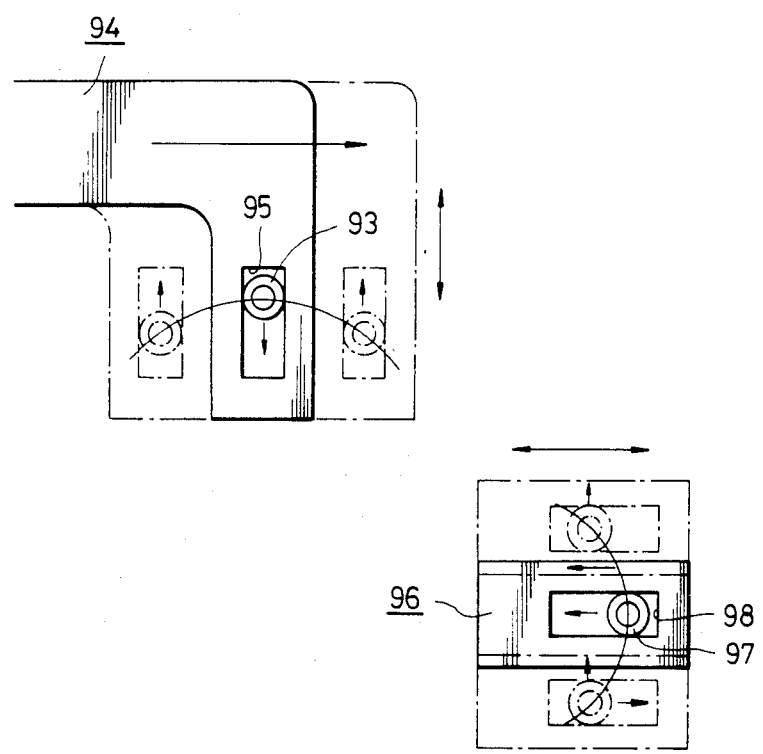
FIG. 2 is a schematic plan view showing the action of the link mechanism in FIG. 1.
Figure 3:
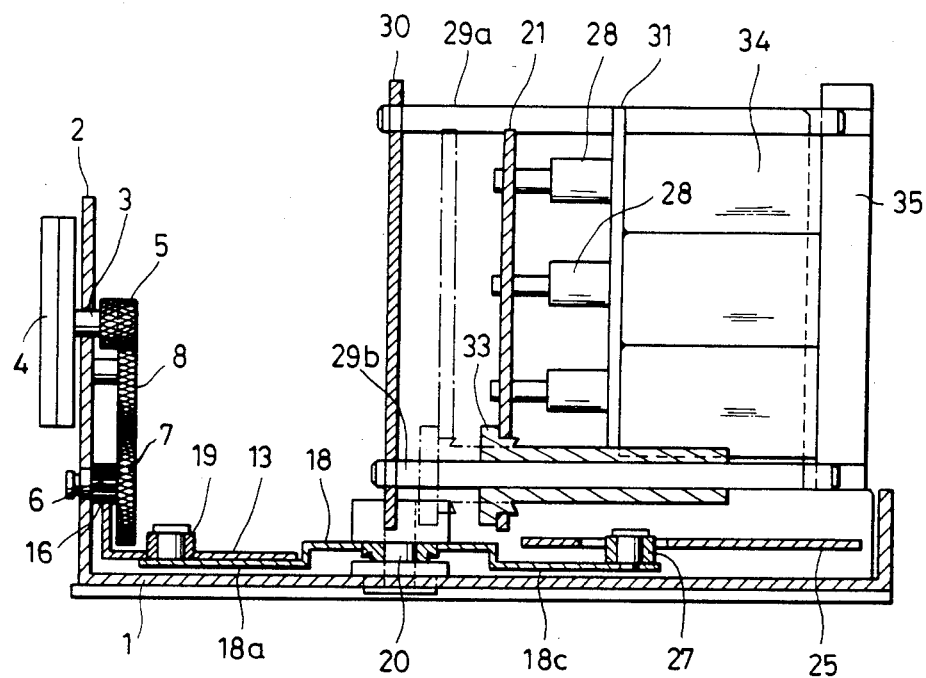
FIG. 3 is an axial-sectional view of an embodiment of pushbutton-operated waveband or station selector in which the link mechanism according to the present invention is adopted.
Figure 4:
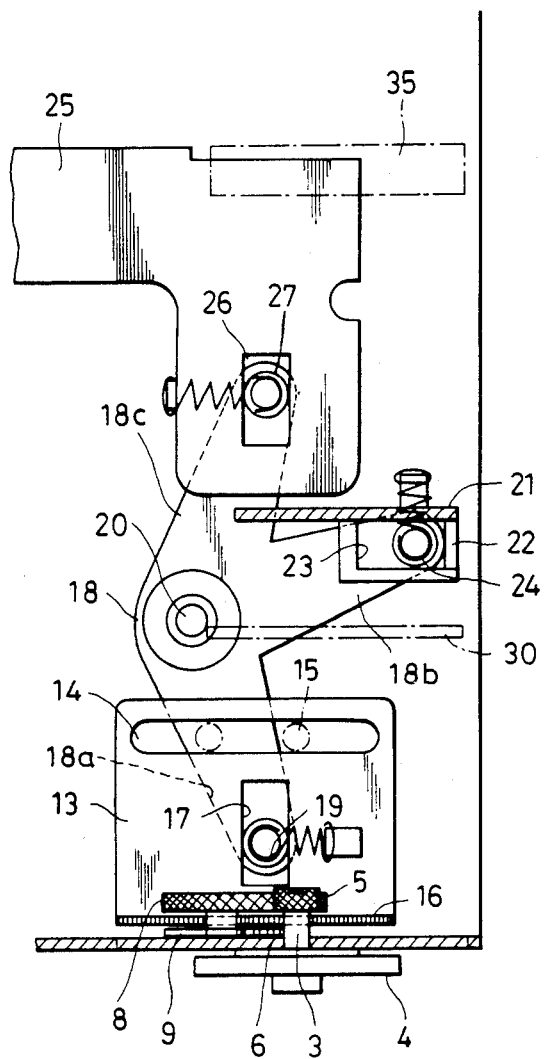
FIG. 4 s a plan view of the embodiment in FIG. 3.

It should be noted that, the present invention is not limited to the embodiment having been illustrated and described in the foregoing; for example, the present invention is also applicable to a two-armed link which couples only two members different in moving direction, such as memory plate and core slide, or slide plate on tuning-knob side and core slide, as in the conventional apparatus shown in FIG. 1. The means of coupling the link and each of the members are not limited to the elongated guide holes and guide rollers, but pins may be used for the guide rollers, and recess-like guides may be used for the guide holes.

I claim:

1. A link mechanism in a pushbutton-operated waveband or station selector, comprising:
   a link member having at least three arms and pivotably disposed in said waveband or station selector;
   a guide member provided on each of said arms of said link member;
   a plurality of tuning members equal in number to said arms which are moved in directions different from each other inside said selector;
   said tuning members each having formed therein a guide portion extending perpendicular to the moving direction of the tuning member, the guide member provided at each of the arms of said link being engaged in said guide portion formed in each of the tuning members; the angle formed between each of said link arms and the moving direction of each tuning member being other than a right angle within the moving range of each of said tuning members, and in which one of said tuning members is a memory plate engaged by one of said link arms and moved in a first direction when a manual pushing operation for tuning is effected, one of said tuning members is a core slide engaged by another of said link arms and movable in a second direction non-linear to said first direction, and one of said tuning members is an idler plate engaged by a third of said link arms and movable in a third direction non-linear to said second direction.

* * * * *